United States Patent [19]

McAlister et al.

[11] 4,348,741

[45] Sep. 7, 1982

[54] PRIORITY ENCODER

[75] Inventors: Doyle V. McAlister, Pflugerville; Thomas G. Gunter, Austin; Michael E. Spak, Kyle; Gene A. Schriber, Austin, all of Tex.

[73] Assignee: Motorola, Inc., Schaumburg, Ill.

[21] Appl. No.: 169,558

[22] Filed: Jul. 17, 1980

[51] Int. Cl.³ .............................................. G06F 7/00
[52] U.S. Cl. ................................ 364/900; 235/92 DP
[58] Field of Search ... 364/200 MS File, 900 MS File; 235/92 CP, 92 CV, 92 DP, 92 PE, 92 R; 340/825.5, 825.51; 328/190, 191, 192

[56] References Cited

U.S. PATENT DOCUMENTS 3,311,881  3/1967  Mellott ........................... 340/825.51

*Primary Examiner*—Gareth D. Shaw
*Assistant Examiner*—Thomas M. Heckler
*Attorney, Agent, or Firm*—Anthony J. Sarli, Jr.; Vincent B. Ingrassia; Jeffrey Van Myers

[57] ABSTRACT

Each channel of a priority encoder register is equipped with a latch for storing one bit of a binary data word. The channel of highest priority generates an output which is applied to encoding means which in turn generates a unique code. The channel output is also fed back to reset its associated latch to permit the channel of next highest priority to generate an output.

15 Claims, 5 Drawing Figures

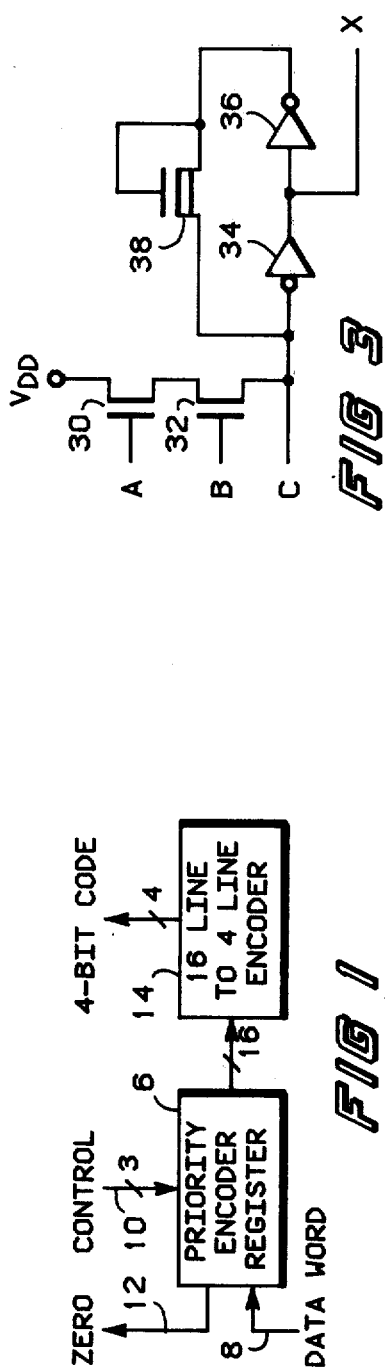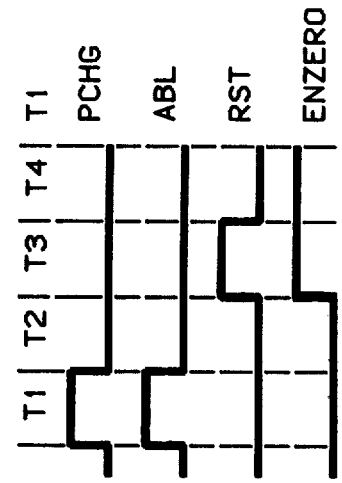

PRIORITY ENCODER

BACKGROUND

1. Field of the Invention

This invention relates generally to data processing systems and, more particularly, to priority encoding circuitry for use in an integrated circuit microprocessor.

2. Description of the Prior Art

Recent improvements in MOS semiconductor technology have resulted in advances in large scale integrated circuit microprocessors. Current LSI microprocessors are an order of magnitude more powerful than the previous generation introduced three or four years ago. The latest generation of microprocessors have 16 bit data paths, 16 bit arithmetic capability, and they directly address multiplemegabyte memories. In terms of functional capability and speed, they will out perform all but the high end models of current 16 bit minicomputers. LSI microprocessor design is now at a stage where better implementation techniques are required in order to control complexity and meet tighter design specifications.

As is well known, data processing systems including microprocessors are generally equipped with various data and address registers which either temporarily store information which is to be transferred to memory in a WRITE mode or which receive information from memory in a READ mode. In some instances, it is necessary to store information into or extract information from selected ones of this plurality of registers in accordance with some predefined priority scheme. For example, the MC68000 microprocessor chip generally available from Motorola, Inc. utilizes a "load and store multiple" instruction which cause information stored in various data registers in the microprocessor to be stored into memory or, on the other hand, which causes information in memory to be read into specific ones of these registers. For this purpose, a multi-bit word is constructed within the microprocessor which indicates which registers are to be manipulated and in what priority. For example, if each of the individual bits of a data word represent separate and distinct registers, then a logic one in any particular bit position will indicate that its associated register is to be either read into or read from. Furthermore, the relative priority of operations associated with any one particular register with respect to the others may be determined by the relative position of its associated bit in the data word. Thus, for example, a register whose associated bit position occupies the least significant bit of the data word may be given highest priority while one associated with the most significant bit position may be given the lowest priority. It is necessary, however, to monitor each of the bit positions in order to detect the bit position of highest priority containing a logic one so as to perform the required operation on its associated register, the bit position containing a logic one of next highest priority in order to perform the required operation on its associated register and so on down the line until the correct operation has been performed on each register whose associated bit in the data word is a logical one.

Two approaches are known for providing the proper priority encoding. First, a decoding circuit may be coupled to each of the bits in the data register word and determine therefrom which register is to be operated on first in accordance with what bits are occupied by logical ones and the relative positions of these bits within the data register word. Once the operation on the register of highest priority has been completed, the decoder must be capable of detecting the register with the second highest priority, then the register with the third highest priority and so on. It should be clear that such a decoding circuit would be of necessity very complex. This would not only require a great deal of silicon area on the integrated circuit chip but which would also increase the power requirements of the chip.

A second known approach is to utilize a digital counter which cycles through a series of counts equivalent to the number of bits in the data register word. For example, during count 1 of the digital counter, bit one of the data register word would be sampled in order to determine if it contained a logical one. If it did, the appropriate operation would be performed on its associated register and the counter would then increment by one count. The next bit in the data register word would then be sampled to determine its contents. This process would continue until each of the bits in the data register word was examined and all operations on the associated registers completed. It should be clear that this technique suffers from the disadvantage of unwanted delays incurred during examination of data registers bits which include a zero indicating that no operation is to be performed on its associated register. These unnecessary delays reduce the overall speed capability of the microprocessor.

SUMMARY OF THE INVENTION

It is an object of the present invention to provide an improved priority encoding scheme.

It is a further object of the present invention to provide a priority encoding circuit for use in a microprocessor which is simple, faster, and occupies less area on the chip.

It is a still further object of the present invention to provide an improved apparatus for performing predetermined operations on selected registers in a data processor in accordance with a predetermined priority scheme.

According to an aspect of the invention there is provided a priority encoder register for receiving a plurality of binary input signals and generating output signals in accordance with a prescribed priority sequence, comprising: a plurality of input means, each coupled to receive one of said binary input signals; a plurality of output means, each coupled to an associated one of said input means and to adjacent ones of said output means, each for generating an output signal if its associated input means has received an input signal of a first logic level; and first means coupled to each of said plurality of output means for blocking all but one of said output signals at a time, said one of said output signals being associated with one of said output means of higher priority, each of said output signals resetting its associated input means to a second logic level to enable another one of said output means of a next lower priority.

According to a further aspect of the invention there is provided a priority encoder register for receiving a plurality of binary input signals and generating therefrom output signals in accordance with the prescribed sequence of priority, comprising: a plurality of storage means, each for storing one of said input signals; a plurality of output means, each one coupled to one of said plurality of storage means and to adjacent ones of said plurality of output means for generating an output indicative of the contents of its associated storage means; first means for forcing all but one of said plurality of output means to a first logic level, said one being the first in said prescribed sequence of priority to be associated with one of said plurality of storage means containing a second logic level; and second means for resetting the storage means associated with said first in said prescribed sequence of priority for forcing all but another one of said plurality of output means to a first logic level, said another one of said output means being the next in said prescribed sequence of priority to be associated with one of said storage means containing said second logic level.

According to a still further aspect of the invention there is provided a priority encoder for receiving a plurality of binary input signals each representing the contents of individual bits in a binary data word, said encoder for generating a unique binary code for each bit in said binary data word representing a first logic level in accordance with a prescribed priority sequence, comprising: a plurality of input means, each coupled to receive one said binary input signals; a plurality of output means, each coupled to an associated one of said input means and to adjacent ones of said output means, each for generating an output signal if its associated input means has received an input signal of a first logic level; first means coupled to each of said plurality of output means for blocking all but one of said output signals at a time, said one of said output signal being associated with one of said output means of higher priority, each of said output signals resetting its associated input means to a second logic level enabling another one of said output means of a next lower priority; and encoding means coupled to said plurality of output means for generating a unique binary code in response to receipt of each of said output signals.

The above and other objects, features and advantages of the present invention will be more clearly understood from the following detailed description taken in conjunction with the accompanying drawings, in which:

BRIEF DESCRIPTION OF THE DRAWINGS

FIG. 1 is a block diagram of a priority encoding scheme;

FIG. 3 is a schematic diagram of the latches employed in the priority encoding register shown in FIG. 2;

FIG. 4 is a timing diagram illustrating waveforms which aid in understanding the inventive priority encoding register.

DESCRIPTION OF THE PREFERRED EMBODIMENT

Figure 2:
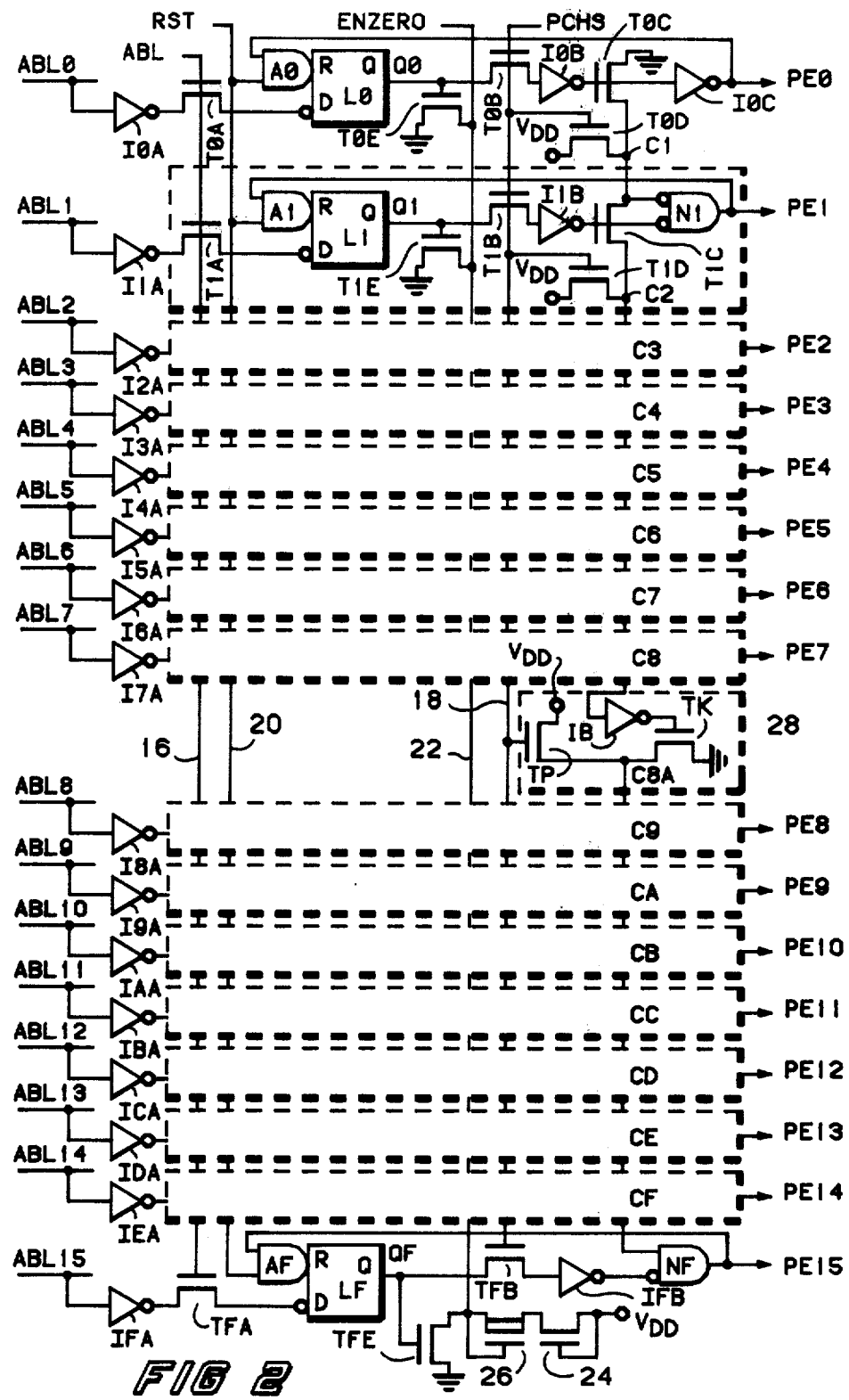
FIG. 2 is a circuit diagram of the inventive priority encoding register.

FIG. 1 is block diagram of a 16 bit priority encoder structure. As can be seen, a priority encoder register 6 receives a 16 bit data word over bus 8. While a 16 bit system is shown, it will be appreciated by one skilled in the art that the arrangement may be made to accommodate a data register words of different lengths.

Priority encoder register 6 is also shown as having a control input 10. While only a single line is shown, several control signals are involved as will be described below. Finally, priority encoder register 6 has an output 12 labeled ZERO which will be more fully described below.

The output of the priority encoder register 6 is applied to a 16 line-to-4 line encoder 14 which generates a 4 bit binary code. The code ranges from 0000 to 1111 and therefore each one of 16 registers may be uniquely identified.

FIG. 2 illustrates in detail the priority encoder register 6 shown in FIG. 1. As can be seen, the circuitry of FIG. 2 includes 16 parallel channels to accommodate the 16 data register bits ABL0–ABL15. To assist in explaining the operation of the circuitry shown in FIG. 2, a cycle is defined as time slots T1, T2, T3 and T4 shown in FIG. 4. If the priority register is to be loaded, a load pulse (ABL) will be applied to conductor 16 at time T1. Signal ABL turns field-effect-transistors (T0A, T1A, T2A . . . TFA) on and thus permits the 16 register bits (ab10–ab115) to be loaded into inverting latches (L0, L1, L2 . . . LF) respectively via inverters I0A, I1A, I2A . . . IFA respectively.

In order to illustrate how the circuitry in FIG. 2 operates, assume that ABL0, ABL1 and ABL15 are at a logical "1" level and that all remaining bits are at a logical "0" level. When ABL goes high at time T1 of the first cycle (FIG. 4), latches L0, L1 and LF would be loaded and exhibit logical "1" levels at their outputs Q0, Q1 and Q15. The outputs of all other latches would remain at a logical "0" level.

A precharge control signal (PCHG) is applied to conductor 18 at time T1 as shown in FIG. 4 turning on transistors T0B, T1B, T2B . . . TFB. Since the output of latches L0, L1 and LF are at a logical "1" level, the output of inverters I0B, I1B and IFB are at a logical zero level. Thus, enhancement type field-effect-transistors T0C and T1C remain off since a low voltage is being applied to their gate electrodes. The low voltage appearing at the output of inverter I0B is supplied to the input of inverter I0C producing a logical "1" at its output. Thus, output line PE0 will be at a logical "1". As will be seen, all other outputs (PE1–PE15) remain low.

When PCHG went high, enhancement type field-effect-transistors T0D, T1D, T2D, etc. were turned on. Each of these devices have a drain electrode coupled to a source of supply voltage ($V_{dd}$), and therefore when they are turned on, nodes C1–CF will be charged to a high voltage level. Since field-effect-transistor T0C is off, the high voltage at node C1 will cause a logical "1" to be applied to a first input NOR gate N1. This will cause a logical zero to appear at its output. Therefore, irrespective of the logic levels appearing at ABL-1–ABL15, a logical "1" output will appear only at PE0. With a high logic level at PE0, a specific code will be forced to appear at the output of encoder 14 shown in FIG. 1. PE1 through PE15 remain at a logical zero level because nodes C1 through CF remain in a precharged state (at a logical "1" level).

Output PE0 is fed back to a first input of AND gate A0, the output of which is coupled to the reset input of latch 10. The second input of AND gate 36 is coupled to a control line 20 on which a reset signal (RST) will appear during time T3 (see FIG. 4). With a logical "1" at both inputs of AND gate A0, latch 10 will reset causing output Q0 to go to a logical zero level. No other latch bits are reset since no other outputs (PE1–PE15) were permitted to go high. Due to the master-slave action of each channel, none of the outputs (PE0–PE15) are permitted to change until the next T1.

During the second cycle, latches L0-LF are again sampled when PCHG goes high. Since the output of latch L0 (Q0) was reset at time T3 of the previous cycle, Q0 now resides at a logical zero level causing the input of amplifier I0C to reside at a logical "1" level. Thus, output PE0 assumes a logical zero level. Furthermore, with a logical one appearing at the gate electrode of enhancement device T0C, the device turns on causing node C1 to discharge. This removes the logical "1" level at the first input of NOR gate N1, thus permitting the output of NOR gate 34 to track the signal appearing on its second input.

After latch L0 has been reset, only latches L1 and LF output logical ones. All other latches contain logical zeros. Therefore, a logical "1" is presented the input of inverter I1B resulting in a low voltage at the gate electrode of transistor T1C. As a result, transistor T1C remains off, and a logical zero level is applied to the second input of NOR gate N1. With zeroes at both inputs of NOR gate N1, output PE1 becomes a logical "1".

In the manner described above, output PE1 is fed back to latch L1 and in conjunction with the reset signal appearing at time T3 on conductor 20, latch L1 will reset.

After latch L0 was reset and after the subsequent precharge signal (PCHG) occurred, device T0C was turned on causing node C1 to discharge to ground. However, nodes C2-CF remain at high levels since there is no path available to discharge these nodes. Thus, PE2 through PE15 are forced to a logical zero during the remaining part of the second cycle. Since PE0 is now a zero and PE1 is a one, PE1 forces a different code out of encoder 14 (FIG. 1). This different code corresponds to a different register.

During the third cycle, latches L0-LF are again sampled at time T1 and C1-CF are precharged by precharge signal PCHG occurring on conductor 18. Since all remaining input bits are at a logical zero with the exception of ABL15, only the input of amplifier IFB is at a logical one level. Thus, transistors T0C through TEC are on allowing nodes C1 through CE to discharge to ground. Outputs PE0 through PE14 are all zeros because the outputs of inverters I0B through IEB are all at logical one levels. Since PE15 is at a logical one level, a different code appears at the output of encoder 14.

As can be seen, the output of each latch L0-LF is coupled to the gate electrode of a field effect transistor T0E-TFE respectively. The source of each of these field-effect-transistors is coupled to ground and its drain is coupled to conductor 22 labeled ENZERO. As long as any one of the latches L0-LF contains a logical "1", then at least one of transistors T0E-TFE will be turned on pulling conductor 22 (ENZERO) to ground. However, when all of the latches are reset, all of transistors T0E-TFE are off. In this case, ENZERO is pulled high through the action of enhancement device 24 and depletion device 26 which are coupled in series between conductor 22 and the source of supply voltage $V_{dd}$.

In order to improve the speed of the structure shown in FIG. 2, a regeneration circuit 28 may be placed between the seventh and eighth channels. This regeneration circuit comprises inverter IB, transistor TP having a gate electrode coupled to conductor 18 (PCHG), a drain electrode coupled to the source of supply voltage $V_{dd}$ and a source electrode coupled to node C8A. Inverter IB has an input coupled to node C8 and an output coupled to the gate of transistor TK. Transistor TK has a source electrode coupled to ground and a drain electrode coupled to node C8A.

FIG. 3 illustrates a latch circuit suitable for use in the priority encoding register shown in FIG. 2. As can be seen, the latch circuit comprises first and second enhancement type transistors 30 and 32, first and second inverters 34 and 36 and depletion type field-effect-transistor 38.

Figure 5:
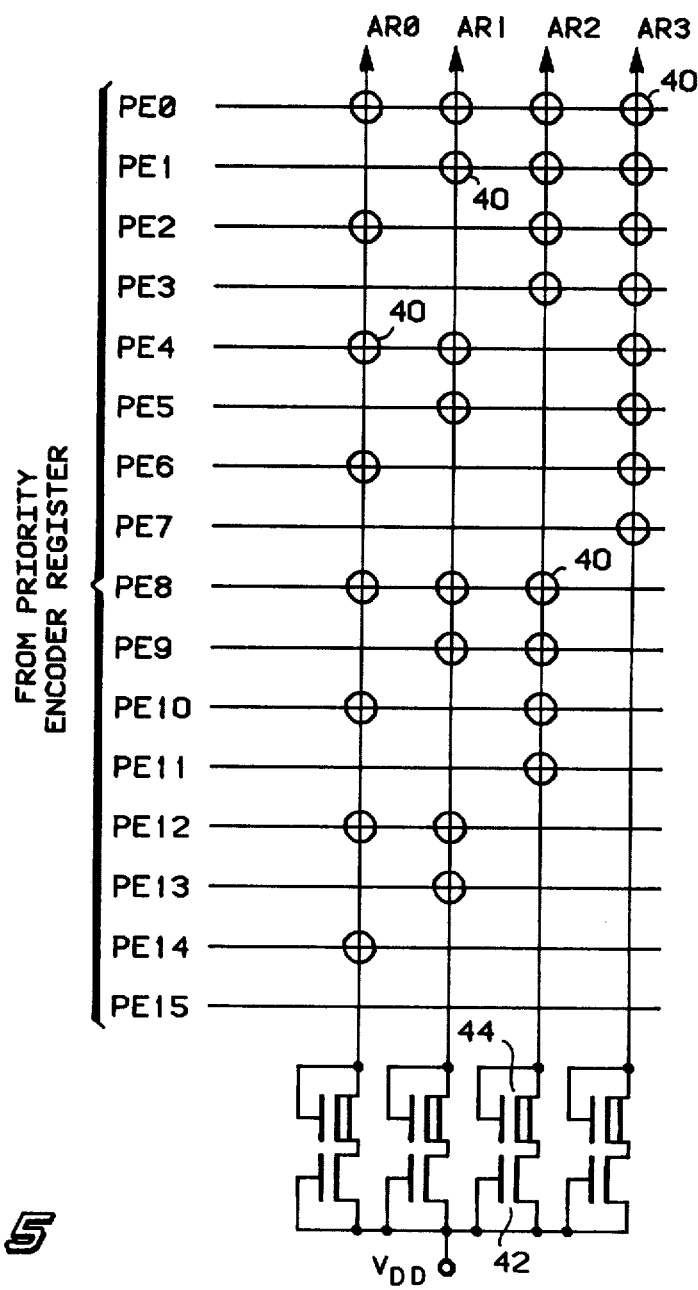
FIG. 5 is a schematic diagram of a 16 line to 4 line encoder for use in conjunction with the priority encoding register shown in FIG. 2.

FIG. 5 illustrates in detail the encoder 14 shown in FIG. 1. As can be seen, the 16 outputs (PE0-PE15) from priority encoder register form the horizontal conductors in FIG. 4. Depending on which of the 16 horizontal conductors is high in accordance with the technique described above, a unique 4 bit code will be generated at outputs AR0-AR3.

As can be seen, certain ones of the intersections of the horizontal conductors and vertical conductors are surrounded by the circle such as is shown at 40. The circle indicates the presence of a field-effect-transistor having a source electrode coupled to ground, a gate electrode coupled to the horizontal conductor and a drain electrode coupled to the vertical conductor such that when a high logic level is placed on the horizontal conductor, the field-effect-transistor will be turned on pulling the vertical conductor to ground. For example, when PE0 is high, lines AR0, AR1, AR2 and AR3 will be pulled to ground resulting in an output code of 0000. If, for example, PE4 were high, AR0, AR1 and AR3 will be pulled to ground. AR2 will not be pulled to ground but would remain high due to the action of pullup transistors 42 and 44. Thus, the output code in this case will be 0100 where AR0 is the least significant bit. As can be seen, each of the 16 inputs will results in a unique 4-bit code output, and each of the 4-bit codes represents an individual register which is to be acted upon as described above.

The above description is given by way of example only. Changes in form and details may be made by one skilled in the art without departing from the scope of the invention as defined by the appended claims.

We claim:

1. A priority encoder register for receiving a plurality of binary input signals and generating output signals in accordance with a prescribed priority sequence, comprising:
   a plurality of input means, each coupled to receive one of said binary input signals;
   a plurality of output means, each coupled to an associated one of said input means and to adjacent ones of said output means, each for generating an output signal if its associated input means has received an input signal of a first logic level; and
   first means coupled to each of said plurality of output means for blocking all but one of said output signals at a time, said one of said output signals being associated with one of said output means of higher priority, each of said output signals resetting its associated input means to a second logic level to enable another one of said output means of a next lower priority.

2. A priority encoder register according to claim 1 further including second means for monitoring each of said plurality of input means and for indicating when all of said input means contain said second logic level.

3. A priority encoder register according to claim 1 wherein each of said input means comprises:
   a storage latch;

third means for loading said storage latch with said input signal during a first time interval; and fourth means coupled to said storage latch and responsive to said output signal for resetting said storage latch.

4. A priority encoder register according to claim 3 wherein each of said output means comprises logic means having at least a first input coupled to the output of its associated storage means and having an output which is coupled to said fourth means.

5. A priority encoder register according to claim 4 wherein all but the first of said output means is equipped with a disabling input which is coupled to said first means.

6. A priority encoder register according to claim 5 wherein said blocking means comprises:
means coupled to said disabling input for charging said disabling input to a voltage level which will cause said logic means to be disabled; and
means for discharging said disabling input if all previous input means contain a second logic level.

7. A priority encoder register according to claim 6 wherein said second means comprises:
a plurality of field effect transistors, each one coupled to the output of its associated latch, each of said plurality of field effect transistors having a gate coupled to the output of its associated latch, a source coupled to ground and a drain coupled to the drains of each of the others of said plurality of field-effect-transistors; and
means for pulling the common drains of each of said plurality of field-effect-transistors high when all of said plurality of field effect transistors are turned off.

8. A priority encoder register for receiving a plurality of binary input signals and generating therefrom output signals in accordance with the prescribed sequence of priority, comprising:
a plurality of storage means, each for storing one of said input signals;
a plurality of output means, each one coupled to one of said plurality of storage means and to adjacent ones of said plurality of output means for generating an output indicative of the contents of its associated storage means;
first means for forcing all but one of said plurality of output means to a first logic level, said one being the first in said prescribed sequence of priority to be associated with one of said plurality of storage means containing a second logic level; and
second means for resetting the storage means associated with said first in said prescribed sequence of priority for forcing all but another one of said plurality of output means to a first logic level, said another one of said output means being the next in said prescribed sequence of priority to be associated with one of said storage means containing said second logic level.

9. A priority encoder register according to claim 8 further including third means for monitoring each of said plurality of storage means and for indicating when all of said storage means contain said first logic level.

10. A priority encoder register according to claim 8 wherein each of said output means comprises logic means having at least a first input coupled to the output of its associated storage means and having an output which is coupled to said second means.

11. A priority encoder register according to claim 10 wherein all but the first of said output means is equipped with a disabling input which is coupled to said first means.

12. A priority encoder register according to claim 11 wherein said first means comprises:
means coupled to said disabling input for charging said disabling input to a voltage level which will cause said logic means to be blocked; and
means for discharging said disabling input if all previous ones of said plurality of storage means contain said first logic level.

13. A priority and coder register according to claim 12 wherein said third means comprises:
a plurality of field-effect-transistors, each one coupled to the output of its associated storage means, each of said plurality of field-effect-transistors having a gate electrode coupled to the output of its associated storage means, a source coupled to ground and a drain coupled to the drains of each of the others of said plurality of field-effect-transistors; and
means for pulling the drain electrodes of each of said plurality of field-effect-transistors high when all of said plurality of field-effect-transistors are turned off.

14. A priority encoder for receiving a plurality of binary input signals each representing the contents of individual bits in a binary data word, said encoder for generating a unique binary code for each bit in said binary data word representing a first logic level in accordance with a prescribed priority sequence, comprising:
a plurality of input means, each coupled to receive one said binary input signals;
a plurality of output means, each coupled to an associated one of said input means and to adjacent ones of said output means, each for generating an output signal if its associated input means has received an input signal of a first logic level;
first means coupled to each of said plurality of output means for blocking all but one of said output signals at a time, said one of said output signal being associated with one of said output means of higher priority, each of said output signals resetting its associated input means to a second logic level enabling another one of said output means of a next lower priority; and
encoding means coupled to said plurality of output means for generating a unique binary code in response to receipt of each of said output signals.

15. A priority according to claim 14 further including second means for monitoring each of said plurality of input means and for indicating when all of said input means contains said second logic level.

* * * * *